(12) United States Patent
Wang et al.

(10) Patent No.: US 11,093,214 B2
(45) Date of Patent: Aug. 17, 2021

(54) DOMINO FULL ADDER BASED ON DELAYED GATING POSITIVE FEEDBACK

(71) Applicant: Ningbo University, Zhejiang (CN)

(72) Inventors: Pengjun Wang, Zhejiang (CN);
Xiaotian Zhang, Zhejiang (CN);
Huihong Zhang, Zhejiang (CN);
Yuejun Zhang, Zhejiang (CN);
Haizhen Yu, Zhejiang (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 17/069,834

(22) Filed: Oct. 13, 2020

(65) Prior Publication Data

US 2021/0109710 A1    Apr. 15, 2021

(30) Foreign Application Priority Data

Oct. 14, 2019    (CN) .......................... 201910973436.1

(51) Int. Cl.
*G06F 7/507* (2006.01)
*H03K 19/003* (2006.01)
*H03K 19/0948* (2006.01)

(52) U.S. Cl.
CPC ....... *G06F 7/507* (2013.01); *H03K 19/00323* (2013.01); *H03K 19/0948* (2013.01)

(58) Field of Classification Search
None
See application file for complete search history.

(56) References Cited

U.S. PATENT DOCUMENTS

| 10,924,118 B1* | 2/2021 | Wang ............... H03K 19/00323 |
| 2016/0092170 A1* | 3/2016 | Nandi ............... H03K 19/0013 |
| | | 708/230 |
| 2020/0065065 A1* | 2/2020 | Wei .................. H03K 19/01742 |

OTHER PUBLICATIONS

Preetisudha Meher, et al., "A High Speed Low Noise CMOS Dynamic Full Adder cell", International conference on Circuits, Controls and Communications (CCUBE), Dec. 2013, pp. 1-4.
Sang-Yun Ahn, et al., "Small-swing domino logic based on twist-connected transistors", Electronics Letters, vol. 50, Issue: 15, Jul. 24, 2014, pp. 1-2.
Xin-Xiang Lian, et al, "Dynamic-static hybrid near-threshold-voltage adder design for ultra-low power applications", IEICE Electron Express, Dec. 11, 2014, pp. 1-6.
Jinhui Wang, et al., "Low power and high performance Zipper domino circuits with charge recycle path", 9th International Conference on Solid-State and Integrated-Circuit Technology, Oct. 20-23, 2008, pp. 1-4.

* cited by examiner

*Primary Examiner* — Jany Richardson
(74) *Attorney, Agent, or Firm* — JCIPRNET

(57) ABSTRACT

A domino full adder based on delayed gating positive feedback comprises a first PMOS transistor, a second PMOS transistor, a third PMOS transistor, a fourth PMOS transistor, a fifth PMOS transistor, a sixth PMOS transistor, a seventh PMOS transistor, an eighth PMOS transistor, a ninth PMOS transistor, a first NMOS transistor, a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor, a first inverter, a second inverter, a third inverter and a fourth inverter.

1 Claim, 3 Drawing Sheets

DOMINO FULL ADDER BASED ON DELAYED GATING POSITIVE FEEDBACK

CROSS-REFERENCE TO RELATED APPLICATION

This application claims the priority benefit of China application serial no. 201910973436.1, filed on Oct. 14, 2019. The entirety of the above-mentioned patent application is hereby incorporated by reference herein and made a part of this specification.

TECHNICAL FIELD

The invention relates to a domino full adder, in particular to a domino full adder based on delayed gating positive feedback.

DESCRIPTION OF RELATED ART

Addition is a widely used basic arithmetic operation. In the design of digital circuit systems such as specific digital signal processing architectures and microprocessors, the operation performance of full adders has a decisive influence on the overall system performance. Compared with the CMOS logic, the dynamic domino logic has remarkable advantages in speed and area overhead because of its non-complementary structure and dynamic operating features. Due to the negative effects such as sub-threshold leak currents and charge sharing, digital circuits designed based on the dynamic domino logic have drawbacks in the aspect of noise margin. At present, charges are typically supplemented by means of positive feedback to increase the noise margin of such digital circuits. But meanwhile, the positive feedback may hinder state changes of such circuits, thus restraining further improvement on the speed performance of these circuits.

In Literature 1 (Meher P, Mahapatra K K. A High Speed Low Noise CMOS Dynamic Full Adder Cell [C]. IEEE International Conference on Circuits, 2014: 1-4), Mether P, et al. put forward a semi-domino logic adder, which is improved upon the dynamic domino logic to enhance the speed performance of the full adder circuit, but meanwhile, the static power consumption of the full adder is increased. To control the static power consumption of the full adder, in Literature 2 (Ahn S Y, Cho K. Small-swing Domino Logic Based on Twist-connected Transistors[J]. Electronics Letters, 2014, 50(15):1054-1056), Ahn S Y, et al. bring forward a dynamic domino logic adder based on reduced-swing output, which can restrain the static power consumption; however, the addition of diode-connected transistors leads to a poor drive capacity of the dynamic domino logic adder based on reduced-swing output in pre-charge and logic operations and results in weak transmission currents of inter-stage circuit signals, thus compromising the speed performance. In Literature 3 (Lian X X, Wey I C, Peng C C, et al. Dynamic-static Hybrid Near-Threshold-Voltage Adder Design Forultra-Low Power Applications [J]. IEICE Electron Express, 2015, 12(3): 20141122), Lian X X, et al. propose a dynamic-static hybrid adder, which has low power consumption; however, due to the fact that too many transistors are stacked in a pull-down network in this adder, the circuit speed is low. From the above description, the several existing full adders have not yet been comprehensively improved in speed and power consumption.

BRIEF SUMMARY OF THE INVENTION

The technical issue to be settled by the invention is to provide a domino full adder based on delayed gating positive feedback, which is high in operating speed and low in power consumption.

The technical solution adopted by the invention to settle the aforesaid technical issue is as follows: a domino full adder based on delayed gating positive feedback comprises a first PMOS transistor, a second PMOS transistor, a third PMOS transistor, a fourth PMOS transistor, a fifth PMOS transistor, a sixth PMOS transistor, a seventh PMOS transistor, an eighth PMOS transistor, a ninth PMOS transistor, a first NMOS transistor, a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor, a first inverter, a second inverter, a third inverter and a fourth inverter, wherein a source of the first PMOS transistor, a source of the second PMOS transistor, a source of the fourth PMOS transistor, a source of the fifth PMOS transistor, a source of the seventh PMOS transistor and a source of the eighth PMOS transistor are connected, a connecting terminal is a power terminal of the domino full adder, and an external power supply is accessed to the power terminal of the domino full adder; a gate of the first PMOS transistor, a gate of the first NMOS transistor, a gate of the fourth PMOS transistor, a gate of the fourth NMOS transistor, a gate of the seventh PMOS transistor, a gate of the eleventh NMOS transistor and an input terminal of the second inverter are connected, a connecting terminal is a clock terminal of the domino full adder, and an external clock signal is accessed to the clock terminal of the domino full adder; a drain of the first PMOS transistor, a drain of the first NMOS transistor, a drain of the third PMOS transistor and an input terminal of the first inverter are connected; a gate of the second PMOS transistor, a source of the second NMOS transistor, a gate of the third NMOS transistor and a gate of the seventh NMOS transistor are connected, a connecting terminal is a first input terminal of the domino full adder, and a first addend signal is accessed to the first input terminal of the domino full adder; a drain of the second PMOS transistor and a source of the third PMOS transistor are connected; a gate of the third PMOS transistor, a gate of the second NMOS transistor, a source of the third NMOS transistor and a gate of the eighth NMOS transistor are connected, a connecting terminal is a second input terminal of the domino full adder, and a second addend signal is accessed to the second input terminal of the domino full adder; a drain of the fourth PMOS transistor, a drain of the fifth NMOS transistor, a drain of the sixth PMOS transistor, a drain of the seventh NMOS transistor and an input terminal of the third inverter are connected; a drain of the fifth PMOS transistor and a source of the sixth PMOS transistor are connected; a gate of the fifth PMOS transistor and an output terminal of the third inverter are connected, a connecting terminal is an upper-bit carry signal output terminal of the domino full adder, and the upper-bit carry signal output terminal of the domino full adder outputs a carry signal to an upper bit; a gate of the sixth PMOS transistor and an output terminal of the second inverter are connected; a drain of the seventh PMOS transistor, a drain of the eleventh NMOS transistor, a drain of the ninth PMOS transistor and an input terminal of the fourth inverter are connected; a drain of the eighth PMOS transistor and a source of the ninth PMOS transistor are connected; a gate of the eighth PMOS transistor, a gate of the fifth NMOS transistor, a gate of the ninth NMOS transistor and a source of the tenth NMOS transistor are connected, a connecting terminal is a lower-bit carry signal input terminal of the domino full adder, and a lower-bit carry signal is accessed to the lower-bit carry signal input terminal of the domino full adder; a gate of the ninth PMOS transistor, a source of the ninth NMOS transistor, a gate of the tenth NMOS transistor, a gate of the sixth NMOS transistor and an output terminal of the first inverter are connected; a source of the first NMOS transistor, a drain of the second NMOS transistor and a drain of the third NMOS transistor are connected; a drain of the fourth NMOS transistor, a source of the sixth NMOS transistor and a source of the eighth NMOS transistor are connected; a source of the fourth NMOS transistor is grounded; a source of the fifth NMOS transistor and a drain of the sixth NMOS transistor are connected; a source of the seventh NMOS transistor and a drain of the eighth NMOS transistor are connected; a drain of the ninth NMOS transistor, a drain of the tenth NMOS transistor and a source of the eleventh NMOS transistor are connected; and an output terminal of the fourth inverter is a sum signal output terminal of the domino full adder, and the sum signal output terminal of the domino full adder outputs a sum signal.

DETAILED DESCRIPTION OF THE INVENTION

The invention is further expounded below in conjunction with the accompanying drawings and embodiments.

Figure 1:
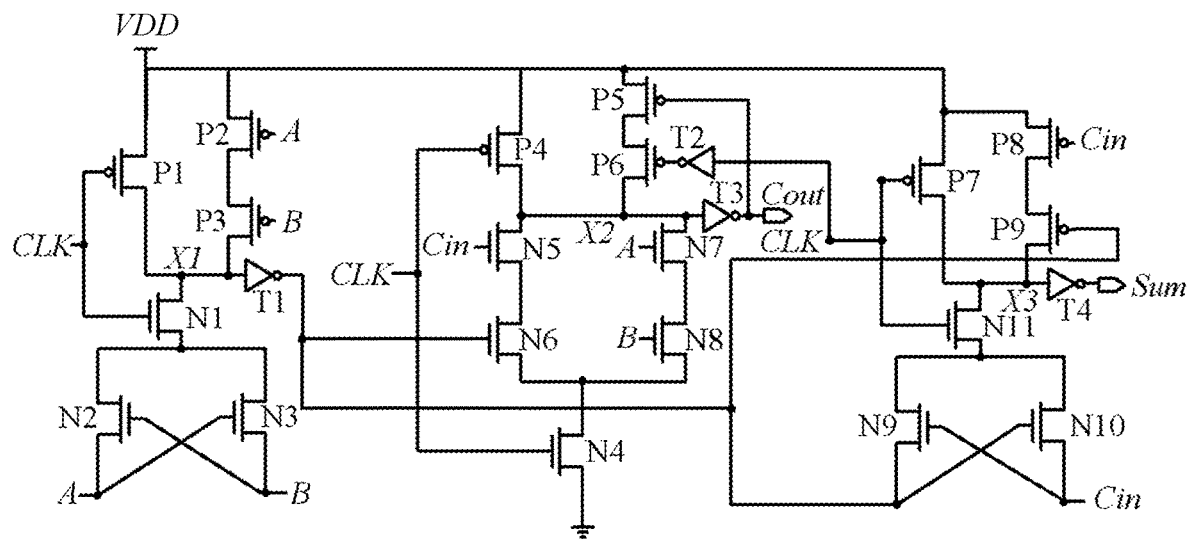
FIG. 1 is a circuit diagram of a domino full adder based on delayed gating positive feedback of the invention.

Embodiment: As shown in FIG. 1, a domino full adder based on delayed gating positive feedback comprises a first PMOS transistor P1, a second PMOS transistor P2, a third PMOS transistor P3, a fourth PMOS transistor P4, a fifth PMOS transistor P5, a sixth PMOS transistor P6, a seventh PMOS transistor P7, an eighth PMOS transistor P8, a ninth PMOS transistor P9, a first NMOS transistor N1, a second NMOS transistor N2, a third NMOS transistor N3, a fourth NMOS transistor N4, a fifth NMOS transistor N4, a sixth NMOS transistor N6, a seventh NMOS transistor N7, an eighth NMOS transistor N8, a ninth NMOS transistor N9, a tenth NMOS transistor N10, an eleventh NMOS transistor N11, a first inverter T1, a second inverter T2, a third inverter T3 and a fourth inverter T4, wherein a source of the first PMOS transistor P1, a source of the second PMOS transistor P2, a source of the fourth PMOS transistor P4, a source of the fifth PMOS transistor P5, a source of the seventh PMOS transistor P7 and a source of the eighth PMOS transistor P8 are connected, a connecting terminal is a power terminal of the domino full adder, and an external power supply VDD is accessed to the power terminal of the domino full adder; a gate of the first PMOS transistor P1, a gate of the first NMOS transistor N1, a gate of the fourth PMOS transistor P4, a gate of the fourth NMOS transistor N4, a gate of the seventh PMOS transistor P7, a gate of the eleventh NMOS transistor N11 and an input terminal of the second inverter T2 are connected, a connecting terminal is a clock terminal of the domino full adder, and an external clock signal CLK is accessed to the clock terminal of the domino full adder; a drain of the first PMOS transistor P1, a drain of the first NMOS transistor N1, a drain of the third PMOS transistor P3 and an input terminal of the first inverter T1 are connected; a gate of the second PMOS transistor P2, a source of the second NMOS transistor N2, a gate of the third NMOS transistor N3 and a gate of the seventh NMOS transistor N7 are connected, a connecting terminal is a first input terminal of the domino full adder, and a first addend signal A is accessed to the first input terminal of the domino full adder; a drain of the second PMOS transistor P2 and a source of the third PMOS transistor P3 are connected; a gate of the third PMOS transistor P3, a gate of the second NMOS transistor N2, a source of the third NMOS transistor N3 and a gate of the eighth NMOS transistor N8 are connected, a connecting terminal is a second input terminal of the domino full adder, and a second addend signal B is accessed to the second input terminal of the domino full adder; a drain of the fourth PMOS transistor P4, a drain of the fifth NMOS transistor N4, a drain of the sixth PMOS transistor P6, a drain of the seventh NMOS transistor N7 and an input terminal of the third inverter T3 are connected; a drain of the fifth PMOS transistor P5 and a source of the sixth PMOS transistor P6 are connected; a gate of the fifth PMOS transistor P5 and an output terminal of the third inverter T3 are connected, a connecting terminal is an upper-bit carry signal output terminal of the domino full adder, and the upper-bit carry signal output terminal of the domino full adder outputs a carry signal Cout to an upper bit; a gate of the sixth PMOS transistor P6 and an output terminal of the second inverter T2 are connected; a drain of the seventh PMOS transistor P7, a drain of the eleventh NMOS transistor N11, a drain of the ninth PMOS transistor P9 and an input terminal of the fourth inverter T4 are connected; a drain of the eighth PMOS transistor P8 and a source of the ninth PMOS transistor P9 are connected; a gate of the eighth PMOS transistor P8, a gate of the fifth NMOS transistor N5, a gate of the ninth NMOS transistor N9 and a source of the tenth NMOS transistor N10 are connected, a connecting terminal is a lower-bit carry signal input terminal of the domino full adder, and a lower-bit carry signal Cin is accessed to the lower-bit carry signal input terminal of the domino full adder; a gate of the ninth PMOS transistor P9, a source of the ninth NMOS transistor N9, a gate of the tenth NMOS transistor N10, a gate of the sixth NMOS transistor N6 and an output terminal of the first inverter T1 are connected; a source of the first NMOS transistor N1, a drain of the second NMOS transistor N2 and a drain of the third NMOS transistor N3 are connected; a drain of the fourth NMOS transistor N4, a source of the sixth NMOS transistor N6 and a source of the eighth NMOS transistor N8 are connected; a source of the fourth NMOS transistor N4 is grounded; a source of the fifth NMOS transistor N5 and a drain of the sixth NMOS transistor N6 are connected; a source of the seventh NMOS transistor N7 and a drain of the eighth NMOS transistor N8 are connected; a drain of the ninth NMOS transistor N9, a drain of the tenth NMOS transistor N10 and a source of the eleventh NMOS transistor N11 are connected; and an output terminal of the fourth inverter T4 is a sum signal output terminal of the domino full adder, and the sum signal output terminal of the domino full adder outputs a sum signal SUM.

Figure 2:
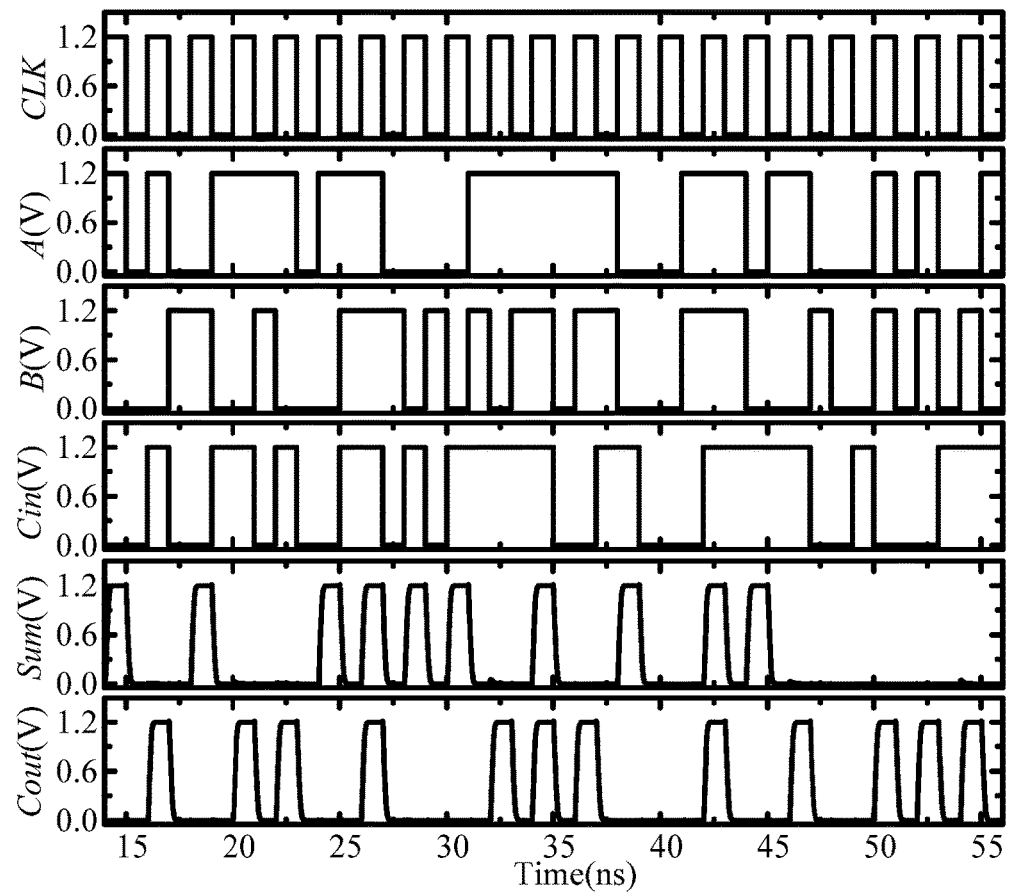
FIG. 2 is a simulated oscillogram of the function of the domino full adder based on delayed gating positive feedback of the invention.

The domino full adder based on delayed gating positive feedback of the invention is simulated, and a simulated oscillogram of the outputs of the domino full adder in all input combination cases is illustrated by FIG. 2. As can be seen by analyzing FIG. 2, when CLK is 0, the circuit is in a precharge state, and Sum and Cout are always at a low level; when CLK is 1, the circuit is in an evaluate state, for example, if the first CLK is at a high level, A=1, B=0, Cin=1, and correspondingly, Sum=0, Cout=1. It can thus be seen from FIG. 2 that the logic function of the domino full adder based on delayed gating positive feedback of the invention is correct.

Figure 3:
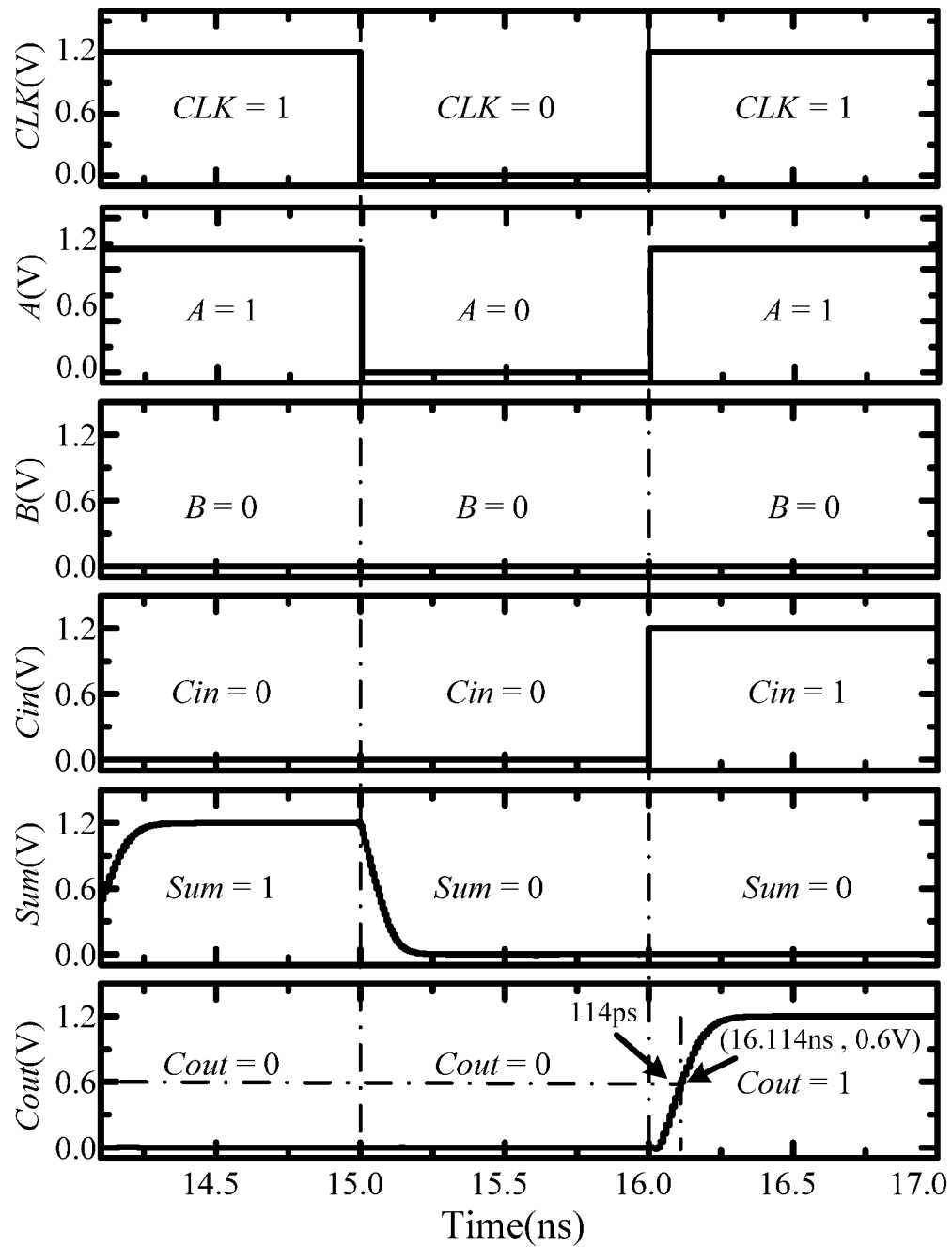
FIG. 3 is a simulated oscillogram of the critical path of the domino full adder based on delayed gating positive feedback of the invention.

Simulated analysis is carried out on the circuit of the domino full adder based on delayed gating positive feedback of the invention under TSMC 65 nm CMOS process parameters by means of HSPICE. All input cases are traversed by means of a pseudorandom sequence, and the output load is set as 20 fF. A simulated oscillogram of the critical path of the domino full adder based on delayed gating positive feedback under a TT process corner and a 1.2V power voltage is illustrated by FIG. 3. FIG. 3 shows the simulated condition of the circuit function in the hopping process of A, B, Cin and CLK from 0000 to 1011, and as can be seen from FIG. 3, the rise delay of the critical path signal Cout is 114 ps.

Figure 4:
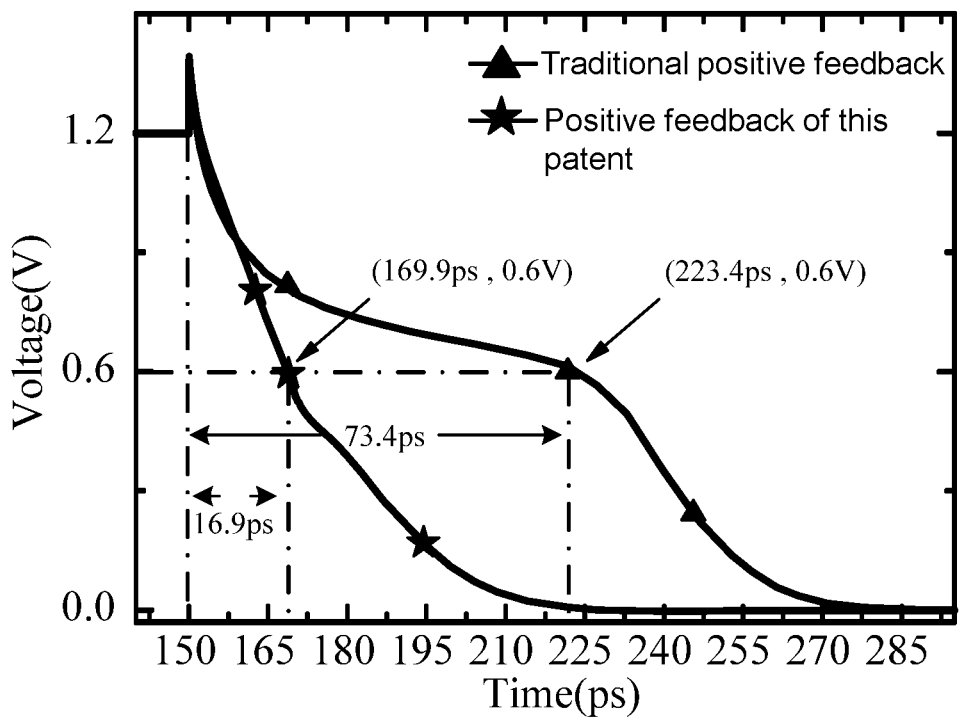
FIG. 4 is a simulated comparison graph of pull-down speeds of the domino full adder based on delayed gating positive feedback of the invention and an existing full adder.

FIG. 4 illustrates a simulated comparison graph of pull-down speeds of the domino full adder based on delayed gating positive feedback of the invention and a partial structure based on traditional positive feedback in Literature 1. As can be seen by analyzing FIG. 4, in the pull-down process, the curve of the traditional positive feedback in Literature 1 has a stationary segment, which is a rewrite excitation for overcoming the competition of the positive feedback and the circuit state, and the speed in this period is very low. The delayed clock gating positive feedback adopted by the invention fulfills a smooth pull-down process, and there is hardly any hindrance from the positive feedback.

To further verify the performance of the domino full adder based on delayed gating positive feedback of the invention, simulation tests are carried out on the adders in Literature 1, Literature 2, Literature 3 and Literature 4 (WANG J, GONG N, GENG S, ET AL. LOW POWER AND HIGH PERFORMANCE ZIPPER DOMINO CIRCUITS WITH CHARGE RECYCLE PATH [C]. INTERNATIONAL CONFERENCE ON SOLID-STATE & INTEGRATED-CIRCUIT TECHNOLOGY, 2008: 2172-2175) and the full adder of the invention respectively under the conditions of SF/125° C./1.08V, TT/25° C./1.2V and FS/-40° C./1.32V. Wherein, the TT/25° C./1.2V condition is a common condition; the SF/125° C./1.08V condition is the worst condition because the positive feedback has a greater power to hinder discharge of the pull-down network in low-speed NMOS and high-speed PMOS cases; and the FS/-40° C./1.32V condition is the optimal condition under which the drive capacity of the pull-down network is superior. Comparative data of simulation results is shown in Table 1.

TABLE 1

Performance comparison data of adders

| Adders | SF/125° C./1.08 V | | TT/25° C./1.2 V | | FS/-40° C./1.32 V | |
|---|---|---|---|---|---|---|
| | Power consumption (μW) | Delay (ps) | Power consumption (μW) | Delay (ps) | Power consumption (μW) | Delay (ps) |
| Literature 1 | 0.85 | 333 | 1.12 | 162 | 1.29 | 108 |
| Literature 2 | 0.89 | 347 | 1.17 | 174 | 1.37 | 111 |
| Literature 3 | 0.95 | 390 | 1.19 | 210 | 1.47 | 122 |
| Literature 4 | 0.71 | 499 | 0.88 | 258 | 1.06 | 136 |
| The invention | 0.86 | 223 | 1.13 | 114 | 1.33 | 85 |

As can be known by analyzing Table 1, compared with the similar optimal adder, the speed performance of the adder of the invention is improved by 21.2% under the FS/-40° C./1.32V condition, by 35.2% under the SF/125° C./1.08V condition and by 29.6% under the TT/25° C./1.2V condition, which indicates that the adder of the invention has better speed performance when handling the problem of competition between the pull-up network and the pull-down network of positive feedback.

Figure 5:
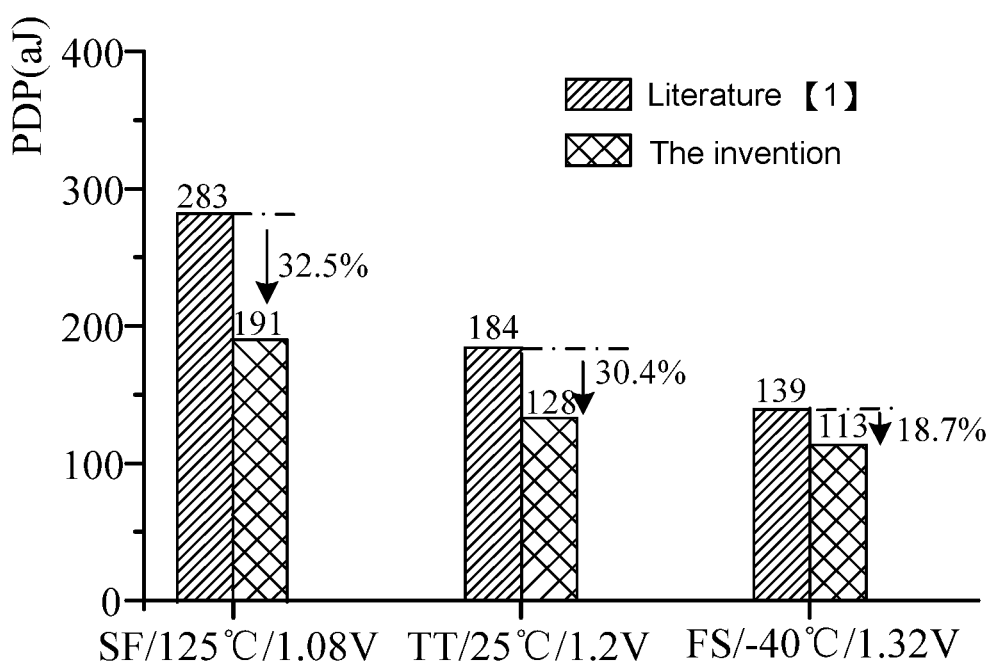
FIG. 5 is a PDP comparison chart of the domino full adder based on delayed gating positive feedback of the invention and four existing full adders.

A PDP comparison chart of the domino full adder based on delayed gating positive feedback of the invention and an existing similar structure with the optimal performance (the adder in Literature 1) under the simulation conditions of SF/125° C./1.08V, TT/25° C./1.2V and FS/-40° C./1.32V is illustrated by FIG. 5. As can be seen by analyzing FIG. 5, compared with the similar structure with the optimal performance, the PDP of the domino full adder based on delayed gating positive feedback of the invention is decreased by 32.5%, 30.4% and 18.7% respectively under these three simulation conditions.

Compared with the prior art, the invention has the following advantages: the domino full adder is constructed by the first PMOS transistor, the second PMOS transistor, the third PMOS transistor, the fourth PMOS transistor, the fifth PMOS transistor, the sixth PMOS transistor, the seventh PMOS transistor, the eighth PMOS transistor, the ninth PMOS transistor, the first NMOS transistor, the second NMOS transistor, the third NMOS transistor, the fourth NMOS transistor, the fifth NMOS transistor, the sixth NMOS transistor, the seventh NMOS transistor, the eighth NMOS transistor, the ninth NMOS transistor, the tenth NMOS transistor, the eleventh NMOS transistor, the first inverter, the second inverter, the third inverter and the fourth inverter; when the clock signal CLK is at a low level "0", the full adder circuit is in a precharge state, the first PMOS transistor, the fourth PMOS transistor and the seventh PMOS transistor are turned on, a dynamic node X1 (a connection node of the drain of the first PMOS transistor, the drain of the first NMOS transistor, the drain of the third PMOS transistor and the input terminal of the first inverter), a dynamic node X2 (connection node of the drain of the fourth PMOS transistor, the drain of the fifth NMOS transistor, the drain of the sixth PMOS transistor, the drain of the seventh NMOS transistor and the input terminal of the third inverter) and a dynamic node X3 (connection node of the drain of the seventh PMOS transistor, the drain of the eleventh NMOS transistor, the drain of the ninth PMOS transistor and the input terminal of the fourth inverter) are charged to a high level "1" through the first PMOS transistor, the fourth PMOS transistor and the seventh PMOS transistor respectively, and at this moment, a sum signal Sum and an upper-bit carry signal Cout will output the low level "0" through the fourth inverter and the third inverter regardless of the values of a first input signal A, a second input signal B and a lower-bit carry signal Cin; when the clock signal CLK is at a high level "1", the first PMOS transistor, the fourth PMOS transistor and the seventh PMOS transistor are turned off, the first NMOS transistor, the fourth NMOS transistor and the eleventh NMOS transistor are turned on, and the dynamic nodes X1, X2 and X3 will be selectively discharged to a low level "0" by means of a pull-down network depending on the input logic of the first input signal A, the second input signal B and the lower-bit carry signal Cin, to complete the logic operation of addition and carry; in the process of logic calculation, the second NMOS transistor and the third NMOS transistor are cross-coupled and the ninth NMOS transistor and the tenth NMOS transistor are cross-coupled to form the pull-down network, the number of the transistors is reduced, and thus, the equivalent resistance of the pull-down network is decreased; selective feedback networks are formed by the second PMOS transistor, the third PMOS transistor and the first inverter and by the eighth PMOS transistor, the ninth PMOS transistor and the fourth inverter, so that the stability of the circuit is improved under the premise that the speed performance of the full adder is not affected; an inverted delay clock gating feedback network is formed by the fifth PMOS transistor, the sixth PMOS transistor, the second inverter and the third inverter to reduce the hindrance of positive feedback, so that the synchronous weak on-time of a pull-up network and a pull-down network of the inverters in a metastable state is shortened, the speed performance is improved, and the overall power consumption is reduced. Therefore, the domino full adder based on delayed gating positive feedback of the invention has a high operating speed and low power consumption.

In summary, the domino full adder based on delayed gating positive feedback has the following advantages: the hindrance of positive feedback is reduced, such that the synchronous weak on-time of a pull-up network and a pull-down network of the inverters in a metastable state is shortened, the speed performance is improved, and the overall power consumption is reduced; and the domino full adder based on delayed gating positive feedback has a high operating speed and low power consumption.

What is claimed is:

1. A domino full adder based on delayed gating positive feedback, the domino full adder comprising:
   a first PMOS (P-type metal-oxide-silicon) transistor, a second PMOS transistor, a third PMOS transistor, a fourth PMOS transistor, a fifth PMOS transistor, a sixth PMOS transistor, a seventh PMOS transistor, an eighth PMOS transistor, a ninth PMOS transistor, a first NMOS (N-type metal-oxide-silicon) transistor, a second NMOS transistor, a third NMOS transistor, a fourth NMOS transistor, a fifth NMOS transistor, a sixth NMOS transistor, a seventh NMOS transistor, an eighth NMOS transistor, a ninth NMOS transistor, a tenth NMOS transistor, an eleventh NMOS transistor, a first inverter, a second inverter, a third inverter and a fourth inverter, wherein a source of the first PMOS transistor, a source of the second PMOS transistor, a source of the fourth PMOS transistor, a source of the fifth PMOS transistor, a source of the seventh PMOS transistor and a source of the eighth PMOS transistor are connected, a connecting terminal is a power terminal of the domino full adder, and an external power supply is accessed to the power terminal of the domino full adder; a gate of the first PMOS transistor, a gate of the first NMOS transistor, a gate of the fourth PMOS transistor, a gate of the fourth NMOS transistor, a gate of the seventh PMOS transistor, a gate of the eleventh NMOS transistor and an input terminal of the second inverter are connected, a connecting terminal is a clock terminal of the domino full adder, and an external clock signal is accessed to the clock terminal of the domino full adder; a drain of the first PMOS transistor, a drain of the first NMOS transistor, a drain of the third PMOS transistor and an input terminal of the first inverter are connected; a gate of the second PMOS transistor, a source of the second NMOS transistor, a gate of the third NMOS transistor and a gate of the seventh NMOS transistor are connected, a connecting terminal is a first input terminal of the domino full adder, and a first addend signal is accessed to the first input terminal of the domino full adder; a drain of the second PMOS transistor and a source of the third PMOS transistor are connected; a gate of the third PMOS transistor, a gate of the second NMOS transistor, a source of the third NMOS transistor and a gate of the eighth NMOS transistor are connected, a connecting terminal is a second input terminal of the domino full adder, and a second addend signal is accessed to the second input terminal of the domino full adder; a drain of the fourth PMOS transistor, a drain of the fifth NMOS transistor, a drain of the sixth PMOS transistor, a drain of the seventh NMOS transistor and an input terminal of the third inverter are connected; a drain of the fifth PMOS transistor and a source of the sixth PMOS transistor are connected; a gate of the fifth PMOS transistor and an output terminal of the third inverter are connected, a connecting terminal is an upper-bit carry signal output terminal of the domino full adder, and the upper-bit carry signal output terminal of the domino full adder outputs a carry signal to an upper bit; a gate of the sixth PMOS transistor and an output terminal of the second inverter are connected; a drain of the seventh PMOS transistor, a drain of the eleventh NMOS transistor, a drain of the ninth PMOS transistor and an input terminal of the fourth inverter are connected; a drain of the eighth PMOS transistor and a source of the ninth PMOS transistor are connected; a gate of the eighth PMOS transistor, a gate of the fifth NMOS transistor, a gate of the ninth NMOS transistor and a source of the tenth NMOS transistor are connected, a connecting terminal is a lower-bit carry signal input terminal of the domino full adder, and a lower-bit carry signal is accessed to the lower-bit carry signal input terminal of the domino full adder; a gate of the ninth PMOS transistor, a source of the ninth NMOS transistor, a gate of the tenth NMOS transistor, a gate of the sixth NMOS transistor and an output terminal of the first inverter are connected; a source of the first NMOS transistor, a drain of the second NMOS transistor and a drain of the third NMOS transistor are connected; a drain of the fourth NMOS transistor, a source of the sixth NMOS transistor and a source of the eighth NMOS transistor are connected; a source of the fourth NMOS transistor is grounded; a source of the fifth NMOS transistor and a drain of the sixth NMOS transistor are connected; a source of the seventh NMOS transistor and a drain of the eighth NMOS transistor are connected; a drain of the ninth NMOS transistor, a drain of the tenth NMOS transistor and a source of the eleventh NMOS transistor are connected; and an output terminal of the fourth inverter is a sum signal output terminal of the domino full adder, and the sum signal output terminal of the domino full adder outputs a sum signal.

* * * * *